United States Patent [19]

Ports

[11] Patent Number: 4,464,825

[45] Date of Patent: Aug. 14, 1984

[54] PROCESS FOR FABRICATION OF HIGH-SPEED RADIATION HARD BIPOLAR SEMICONDUCTOR DEVICES

[75] Inventor: Kenneth A. Ports, Indialantic, Fla.

[73] Assignee: Harris Corporation, Melbourne, Fla.

[21] Appl. No.: 467,295

[22] Filed: Feb. 17, 1983

[51] Int. Cl.³ .................... H01L 21/90; H01L 21/225
[52] U.S. Cl. .................... 29/577 C; 29/578;
  156/657; 357/34; 148/187; 148/188
[58] Field of Search ............... 29/577 C, 578, 576 W;
  156/657; 357/34; 148/187, 188, 1.5

[56] References Cited

U.S. PATENT DOCUMENTS 4,160,991  7/1979  Anantha et al. .................... 357/49
4,269,636  5/1981  Rivoli et al. ........................ 148/175

Primary Examiner—Brian E. Hearn
Assistant Examiner—Alan E. Schiavelli
Attorney, Agent, or Firm—Barnes & Thornburg

[57] ABSTRACT

A thermal oxide is grown on a semiconductor substrate containing single crystal, dielectrically isolated tubs. A silicon nitride layer, serving as a mask for complete self-alignment of collector contacts, bases and emitters is then deposited. After the silicon nitride is patterned, the wafer is reoxidized. The oxide over the emitter and collector contact areas is then etched using the previously patterned silicon nitride film as an alignment mask. The remaining silicon nitride is stripped, a base photoresist pattern is formed and a base impurity ion implant is performed, to define the essential profile of the base. Polysilicon is then deposited and implanted with impurities to form 4000 ohm/square resistors. Silicon dioxide is deposited over the areas of polysilicon which are to become resistors when the polysilicon is patterned, which silicon dioxide masks the polysilicon resistor precursors from the impurities implant conducted for the collector contact, emitter and interconnects. The polysilicon is patterned for resistors, contacts and interconnects. Another photoresist is deposited and patterned to open up contact areas for the formation of schottky barrier diodes and transistor bases. Thereafter, the device is metallized, and processing is completed.

12 Claims, 9 Drawing Figures

PROCESS FOR FABRICATION OF HIGH-SPEED RADIATION HARD BIPOLAR SEMICONDUCTOR DEVICES

FIELD OF THE INVENTION

This invention pertains to a process for the formation of radiation hardened bipolar semiconductor devices and, in particular, a process for producing a high speed, high performance, radiation hardened 4K bipolar RAM.

BACKGROUND OF THE INVENTION

Monolithic integrated circuit technology has been increasingly directed to the production of high speed, high performance bipolar semiconductor devices, such as bipolar RAMs, etc. The performance of integrated circuits incorporating these bipolar devices is sensitive to the spacing between the emitter and the base contact of the device, advance electron beam photolithography being capable of reducing this distance to 2–3 microns. Even greater reduction in spacing is known, as described in U.S. Pat. No. 4,160,991.

A large number of increasingly important applications for semiconductor devices of this type require the devices to be "radiation hard", i.e., capable of performing in high radiation environments which would hamper or disrupt the operation of a device otherwise unshielded. The inventor has developed a process for the production of high speed bipolar devices, in particular, RAMs, which are radiation hardened. The process relies, in part, on complete self-alignment of collectors, bases and emitters, through the use of patterned deposited silicon nitride.

Accordingly, it is an object of this invention to provide a process whereby radiation hard bipolar semiconductor devices may be fabricated.

It is another object of this invention to provide a process for the fabrication of high speed high performance radiation hardened bipolar RAMs. The achievement of these and other objects will be apparent to those of skill in the art through the detailed description provided below.

SUMMARY OF THE INVENTION

A thermal oxide is grown on a semiconductor substrate containing single crystal, dielectrically isolated tubs with buried layers. A silicon nitride layer, serving as a mask for complete self-alignment of collector contact, bases and emitters is then deposited. After the silicon nitride is patterned, the wafer is reoxidized. The oxide over the emitter and collector contact areas is then etched using the previously patterned silicon nitride film. The remaining silicon nitride is stripped, a base photoresist pattern is formed and a boron ion implant is performed, to define the essential profile of the base. Polysilicon is then deposited and implanted with phosphorous to form 4000 ohm/square resistors. Silicon dioxide is deposited over the areas of polysilicon which are to become resistors when the polysilicon is patterned, which silicon dioxide masks the polysilicon resistor precursors from the phosphorous implant conducted for the collector contact and emitter, which implant also forms interconnects. Another photoresist is deposited and patterned to open up contact areas for the formation of schottky barrier diodes and transistor bases. Thereafter, the device is metallized, and processing is completed.

DETAILED DESCRIPTION OF THE INVENTION

As is noted above, the instant process is useful in the production of radiation hardened bipolar semiconductor devices. Although, as will be recognized by those of skill in the art, many distinct types of devices fall within this category, one particularly desirable device is a radiation hardened 4K bipolar RAM, which may be produced by a particularly preferred embodiment of this invention, which is described in detail below. However, the process is not so limited, and should be understood to include other related devices as well.

Figure 1:
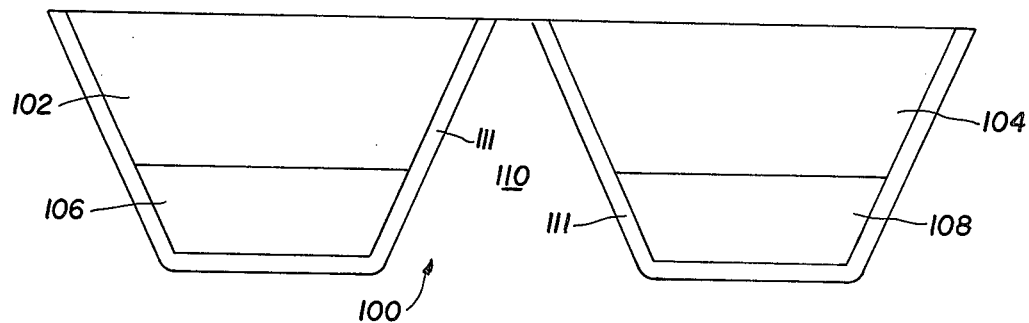
FIG. 1 is a cross-sectional representational illustration of the starting material of this process.

The fabricating process of this invention begins with a completed substrate material 100, illustrated in FIG. 1, containing single crystal, dielectrically isolated tubs 102, 104 with buried layers 106, 108, respectively. The tubs are embedded in a polysilicon support 110 and separated therefrom by a dielectric layer 111. The single crystal is preferably N-type, and, in a preferred embodiment, has a resistivity of 0.2–0.3 ohm-cm while buried layers 106, 108 are N-type having a substantially low resistance. Preferably, this substrate has a 1-0-0 crystal orientation.

Figure 2:
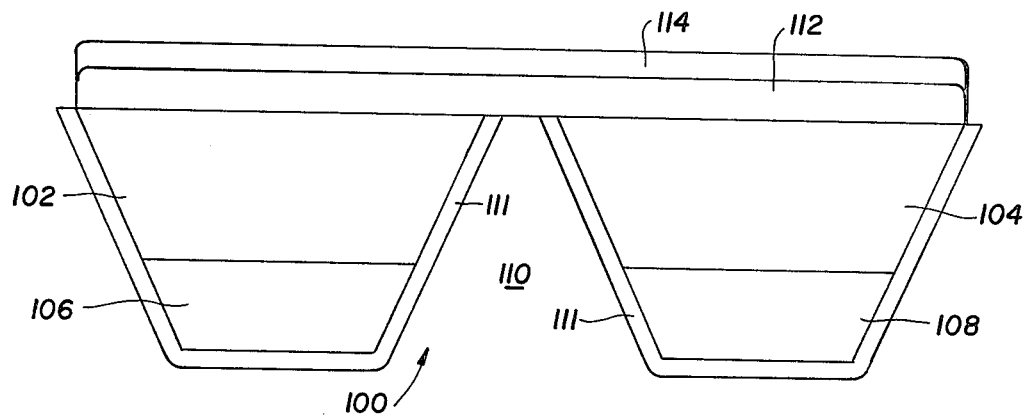
FIGS. 2–8 are cross-sectional representational illustrations of the semiconductor device produced by this process at various process steps.

The first active step of the instant process is the growth of a thermal oxide protective layer 112 on the substrate 100 in a pyrogenic atmosphere. Although the oxide may be of any sufficient thickness to protect the silicon surface underneath, in a preferred embodiment it is about 1500 Angstroms thick. Thereafter, a layer of silicon nitride 114 is deposited through a low pressure chemical vapor deposition step, preferably about 2000 Angstroms in thickness. Silicon nitride layer 114 will serve as a mask for self-alignment and will thereafter be stripped. A cross-section of the device at this stage is illustrated in FIG. 2.

Figure 3:
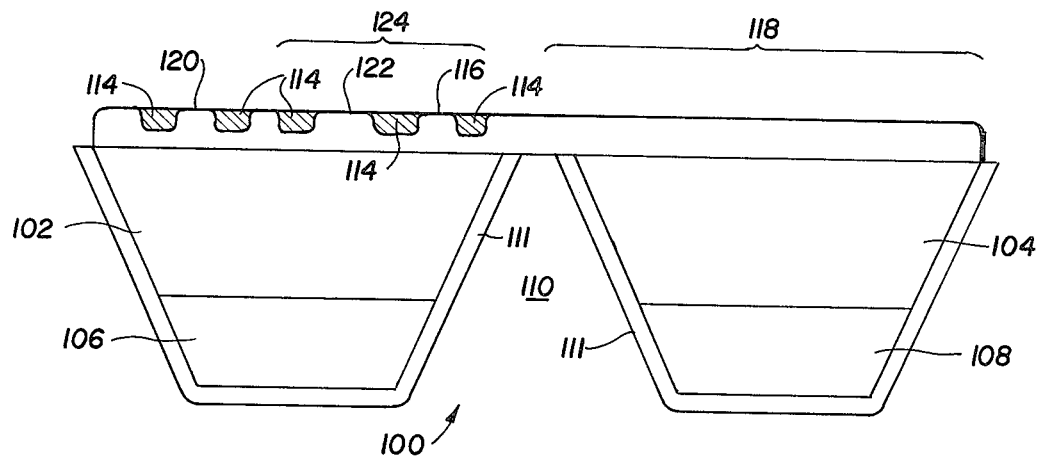

Silicon nitride layer 114 is patterned in a way that information on the location of the collector contacts, bases and emitters is simultaneously transmitted to the substrate 100. The silicon nitride layer 114 is etched to leave no silicon nitride in the emitter 166, field 118, collecter contact 120 and schottky barrier diode 122 areas. Silicon nitride covers the balance of the base area 124, and forms a ring around the collector area. The wafer is then reoxidized to grow oxide layer 112 flush to the top of the remaining silicon nitride layer 114. The reoxidation is performed in a pyrogenic atmosphere and forms field oxides and a thick oxide over the schottky barrier diodes to protect them from subsequent ion implants. The device at this stage is illustrated in FIG. 3.

Figure 4:
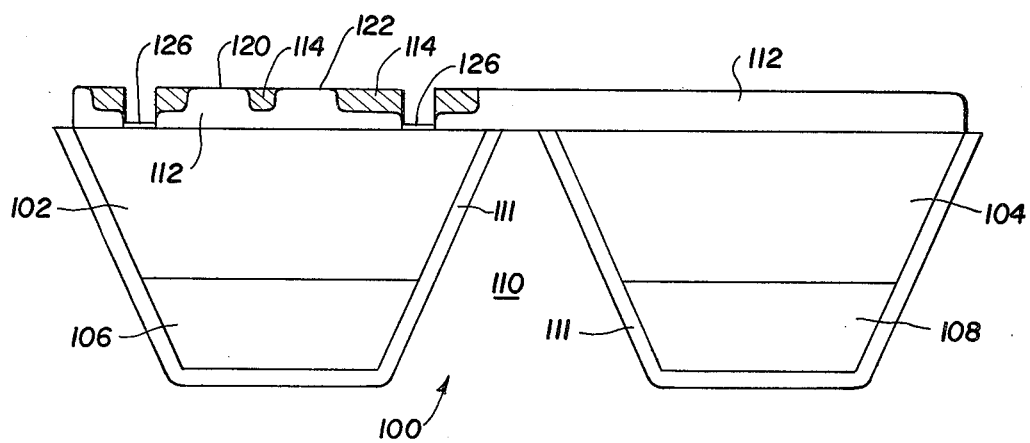

Thereafter, an oversize emitter and collector contact photolithographic mask is applied to protect the field 118 and schotttky barrier diode 122 regions, and the oxide over the emitter 116 and collector contact 120 areas is etched away, using the previously patterned silicon nitride film 114 as a self-alignment mask. This is followed by a short oxidation to grow a thin protective oxide layer 126 over the exposed silicon. The device at this intermediate stage is illustrated in FIG. 4, showing thin oxide layer 126.

Figure 5:
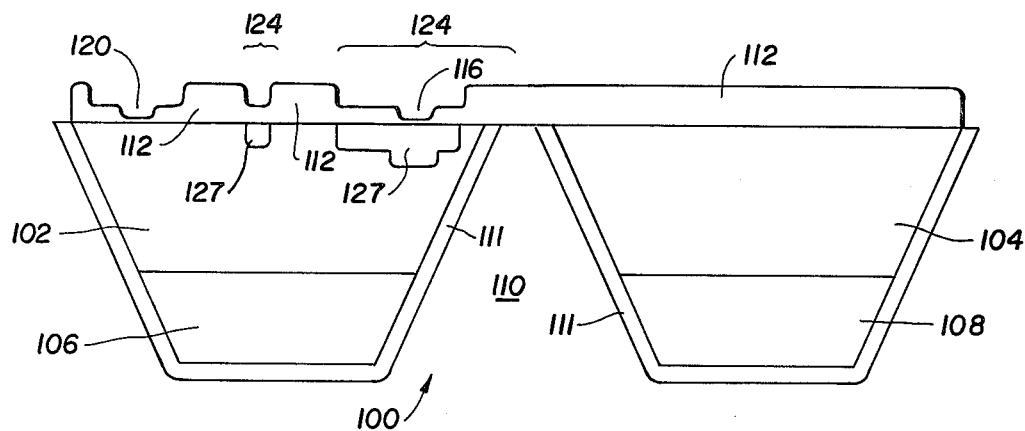

The remaining silicon nitride is then stripped from the wafer. The resulting oxide profile has thicknesses of a few hundred Angstroms over the emitter 116 and collector contact area 120, about 1500 Angstroms over the base area 124 and about 3500 Angstroms field oxide everywhere else providing contoured apertures where polysilicon or other dopant source will be deposited in the formation of the collector contact and emitter. An oversized base photolithographic mask is then formed to shield all non-base areas from the base implant. A dopant of a first conductivity type, preferably boron, ion implant is performed, followed by a short diffusion to move the base away from the surface and to essentially form its final profile, illustrated at 127 in FIG. 5.

Figure 6:
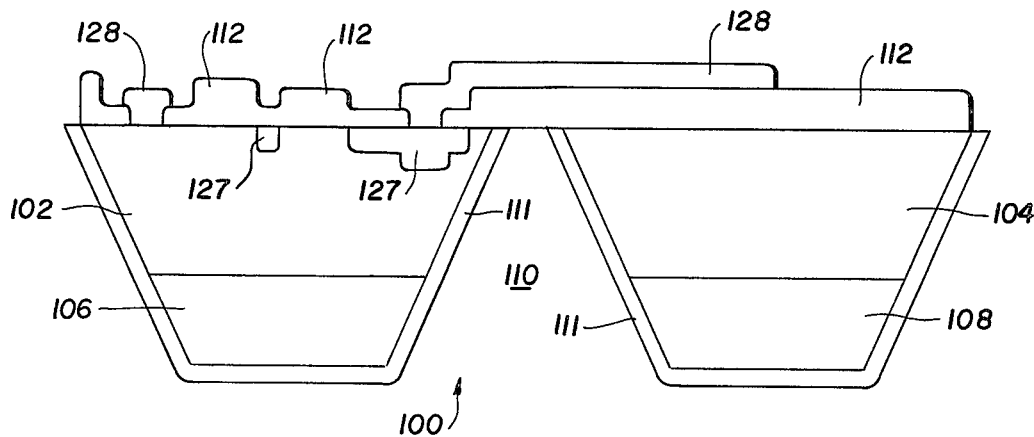

The next phase involves the deposition processing of polysilicon, which will form resistors and first level interconnects, the result of this phase being illustrated in FIG. 6. It begins with a hydroflouric acid wash of the emitter and collector areas to expose the single crystal silicon beneath the thin silicon dioxide layer 126. Polysilicon layer 128 is then deposited, preferably through low pressure chemical vapor deposition techniques, to a thickness of about 3000 Angstroms, followed by a short oxidation to serve as an etch stop for subsequent silicon nitride etching steps. Alternatively, other appropriate dopant sources may be deposited in the contoured apertures for the collector contact and emitter. Phosphorous is non-selectively implanted through the oxide into the polysilicon in a dose appropriate, in the preferred embodiment, for 4000 ohm/square resistors. Silicon dioxide is next deposited, again, preferably through low pressure chemical vapor deposition, and patterned to leave rectangles of silicon dioxide over (not illustrated) areas of polysilicon which are to become 4000 ohm/square resistors when the polysilicon is subsequently patterned. The rectangles of silicon dioxide are used to mask the polysilicon resistors from the heavy implant of phosphorous which is next carried out, to form the emitter and dope the polysilicon where it will be used as an interconnect. The remaining silicon dioxide is thereafter stripped from the wafer. After stripping, the deposited polysilicon 128 is patterned to yield collector contact and emitter regions, sections of interconnect and 4000 ohm/square resistors, etc.

Figure 7:
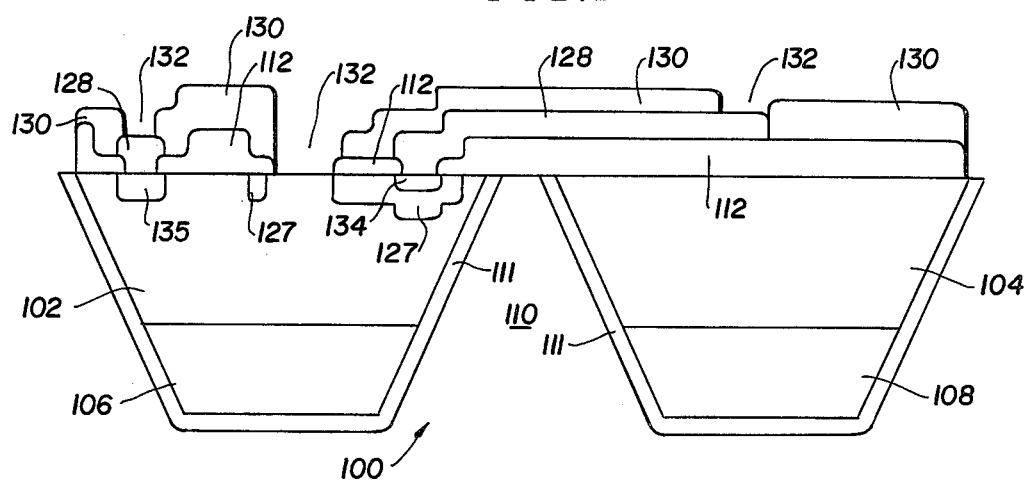

The device precursor is now in condition to be prepared for metallization steps which are generally conventional. Another photoresist step is performed which opens up contact areas 132 for the schottky barrier diode, transistor bases and all other device terminals not previously contacted by thin film polysilicon. A short oxidation process next grows a few hundred Angstroms of protective oxide over these apertures. This is followed by the deposition of the primary passivation layer of the device, silicon nitride layer 130 preferably deposited through low pressure chemical vapor deposition. Preferably, this layer should be about 2000 Angstroms in thickness. Contact apertures for all terminals 132 of all devices are opened in the silicon nitride with a photoresist operation employing the stop previously formed. The final step prior to metallization is a piloted high temperature diffusion step to drive implanted dopant from the polysilicon or other dopant source into the substrate to form emitter 134 and collector contact 135 and obtain desired resistor parameters. The cross-section of the device at this stage, prior to metallization, is illustrated in FIG. 7.

Figure 8:
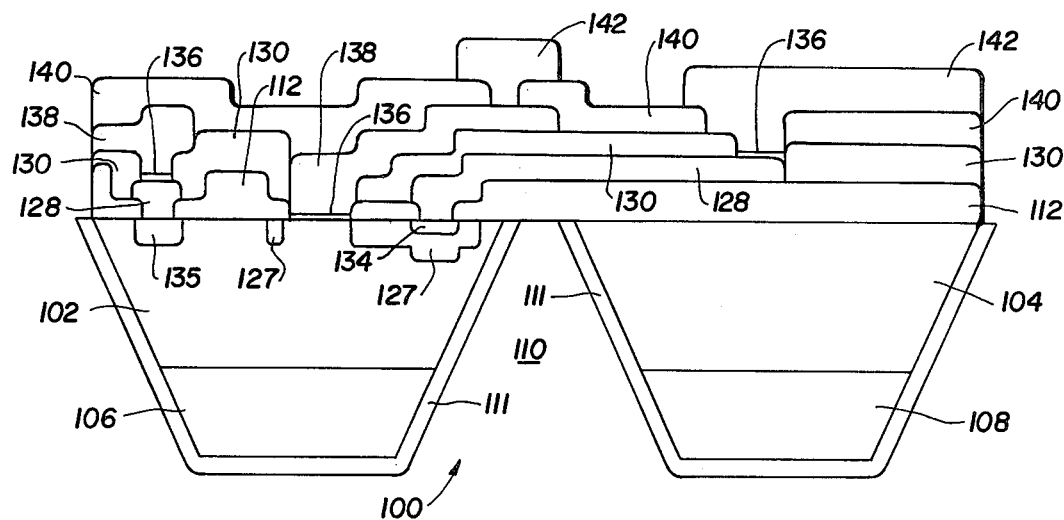

Metallization begins with a platinum sputter, sinter and strip operation, which results in PtSi 136 contacts to all heavily doped regions and schottky barrier diodes in contact apertures opened over lightly doped regions. A first level multi-layer metal system 138 preferably comprising a titanimum-tungsten and aluminum composition, is deposited and patterned, followed by either a chemical deposition of silicon dioxide 140 or plasma silicon nitride deposition to form the intermetal isolation layer. Pathways are patterned into this layer, and a final aluminum interconnect layer 142 is deposited and patterned. At this stage, on completion of metallization, the device is illustrated at FIG. 8.

Figure 9:
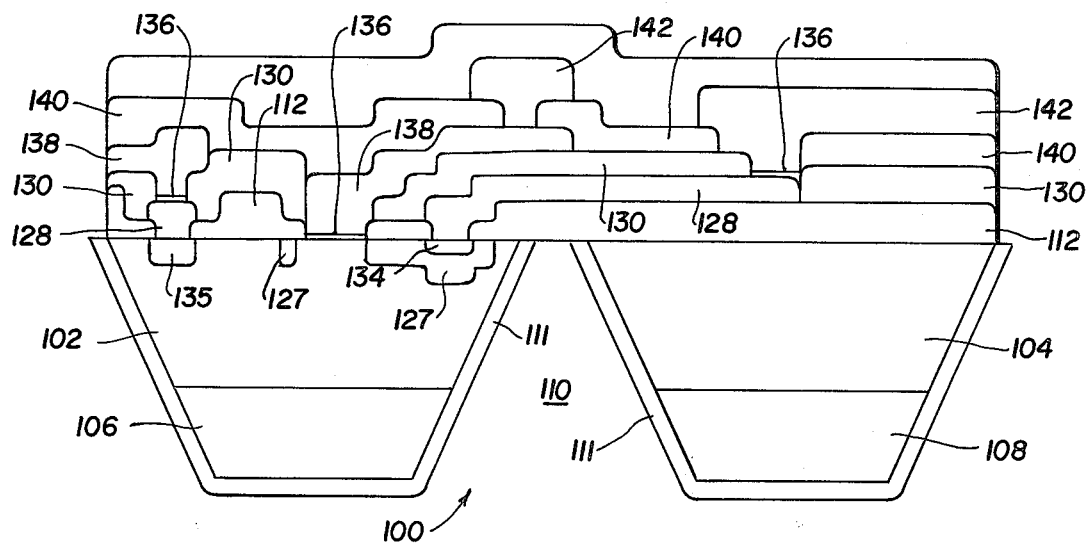
FIG. 9 is a cross-sectional representational illustration of the completed device produced according to this process.

Final processing consists of the deposition and patterning of a top layer of chemical vapor deposited silicon dioxide 144, electrical probing of completed test devices, and backlapping of the wafer, as is conventional. The completed device is illustrated in FIG. 9.

The process of this invention has been described with reference to particular and preferred embodiments. However, variations in process, particularly with respect to dopant types and levels, deposition methods chemical composition, and the nature of the elements formed, will occur to those of ordinary skill in the art without the exercise of inventive faculty, and remain within the scope of the invention.

What is claimed is:

1. A process for the fabrication of irradiation hardened bipolar device, comprising the steps of:
   forming a first protective layer on a surface of a semiconductor substrate having dielectrically isolated tubs of single crystal material;
   forming a layer of silicon nitride over said first protective layer;
   patterning and removing said silicon nitride in those areas overlaying said substrate wherein a collector contact, and emitter are to be formed, leaving said silicon nitride overlaying said substrate (a) in regions adjacent those wherein said emitter is to be formed, and (b) in regions adjacent those wherein said collector contact is to be formed;
   increasing the thickness of said first protective layer in regions where said silicon nitride has been removed;
   removing the portions of said first protective layer overlaying said substrate in regions wherein said collector contact and emitter are to be formed using said patterned silicon nitride layer as a self-alignment mask;
   forming a thin second protective layer over those regions wherein said first protective layer has been removed, said second protective layer having a thickness less than that of first protective layer, whereby contoured apertures in said first protective layer are formed over said collector contact and emitter regions;
   removing all remaining silicon nitride;
   forming a mask to shield apertures in said first protective layer overlaying said substrate except over said base area;
   implanting and diffusing dopant of a first conductivity type to form a base in said substrate;
   removing said second protective layer and thereafter depositing a layer of polysilicon in said contoured apertures and on said first protective layer where formation of resistors and interconnects is desired;

doping said polysilicon a first time to form said resistor regions;

depositing and patterning a shielding layer on said polysilicon to shield said resistor regions;

doping said polysilicon a second time with a dopant of a second conductivity type to form said collector contact and emitter by subsequent high temperature diffusion of said second conductivity type dopant from said polysilicon into said substrates, said second doping simultaneously providing dopant for formation of interconnects in said polysilicon;

removing said shielding layer and patterning said polysilicon to form collector contact and emitter regions, interconnects and resistors; and thereafter passivating, metallizing and completing final processing of said semiconductor device.

2. The process of claim 1, wherein said passivating, metallizing and final processing comprises:

depositing a passivation layer and opening therethrough apertures to regions wherein contact terminals are to be formed;

forming PtSi contacts in all said contact terminal regions;

depositing and patterning a metal layer over said PtSi;

forming an intermetal isolation layer over said metal layer;

opening apertures in said isolation layers;

forming aluminum interconnects in said isolation layer apertures;

depositing a third protective layer over the formed semiconductor device; and conducting electrical probing of said device and backlapping said wafer.

3. The process of claim 1, wherein said polysilicon is deposited through low pressure chemical vapor deposition techniques.

4. The process of claim 1, wherein said single crystal material is N-type, has a 0.2–0.3 ohm-cm resistivity and a 1-0-0 crystal orientation.

5. The process of claim 1, wherein said first protective layer is about 1500 Angstroms thick, said first silicon nitride layer is about 200 Angstroms thick, and said polysilicon is doped said first time to form 4000 ohm/square resistors.

6. The process of claim 1, wherein said first protective layer adjacent said contoured apertures is of first thickness sufficient to mask said substrate from said doping steps and said first protective layer in said contoured apertures is of a second thickness intermediate said first thickness and the thickness of said thin second protective layer.

7. The process of claim 2, wherein said metal layer is comprised of a titanium-tungsten and aluminum composition.

8. The process of claim 2, wherein said intermetal isolation layer is comprised of chemically deposited silicon dioxide.

9. The process of claim 2, wherein said intermetal isolation layer is comprised of plasma deposited silicon nitride.

10. The process of claim 2, wherein said third protective layer is comprised of silicon dioxide formed through chemical vapor deposition techniques.

11. A process for the fabrication of a radiation hardened bipolar device, comprising the steps of:

forming a first protective layer on a surface of a semiconductor substrate having dielectrically isolated tubs of single crystal material;

forming a layer of silicon nitride over said first protective layer;

patterning and removing said silicon nitride in those areas overlaying said substrate wherein a collector contact, and emitter are to be formed, leaving said silicon nitride overlaying said substrate (a) in regions adjacent those wherein said emitter is to be formed and (b) in regions adjacent those wherein said collector contact is to be formed;

increasing the thickness of said first protective layer in regions where said silicon nitride has been removed;

removing the portions of said first protective layer overlaying said substrate in regions wherein said collector contact and emitter are to be formed using said patterned silicon nitride layer as a self-alignment mask;

forming a thin second protective layer over those regions wherein said first protective layer has been removed, said second protective layer having a thickness less than that of first protective layer, whereby contoured apertures in said first protective layer are formed over said collector contact and emitter regions;

removing all remaining silicon nitride;

forming a mask to shield apertures in said first protective layer except over said base area;

implanting and diffusing a first dopant of a first conductivity type to form a base in said substrate;

thereafter depositing a source of a second dopant of a second conductivity type in said contoured inserts; and transferring said second dopant from said source into said substrate by high temperature diffusion to form said collector contact and emitter.

12. A process for fabrication of a radiation hardened bipolar device, comprising the steps of:

forming a first protective layer on a surface of a semiconductor substrate of single crystal material;

forming a layer of silicon nitride over said first protective layer;

patterning and removing said silicon nitride in those areas overlaying said substrate wherein a collector contact, and emitter are to be formed, leaving said silicon nitride overlaying said substrate (a) in regions adjacent those wherein said emitter is to be formed and (b) in regions adjacent those wherein said collector contact is to be formed;

increasing the thickness of said first protective layer in regions where said silicon nitride has been removed;

removing the portions of said first protective layer overlaying said substrate in regions wherein said collector contact and emitter are to be formed using said patterned silicon nitride layer as a self-alignment mask;

removing all remaining silicon nitride whereby contoured apertures in said first protective layer are formed over said collector contact and emitter regions;

forming a mask to shield apertures in said first protective layer except over said base area;

diffusing a first dopant of a first conductivity type to form a base in said substrate;

thereafter depositing a source of a second dopant of a second conductivity type in said contoured inserts; and transferring said second dopant from said source into said substrate by high temperature diffusion to form said collector contact and emitter.

* * * * *

UNITED STATES PATENT AND TRADEMARK OFFICE
CERTIFICATE OF CORRECTION

PATENT NO. : 4,464,825
DATED : August 14, 1984
INVENTOR(S) : Kenneth A. Ports

It is certified that error appears in the above—identified patent and that said Letters Patent is hereby corrected as shown below:

Column 2, line 53, change "166" to --116--.

Claim 5, line 3, change "200" to --2000--.

Signed and Sealed this

Nineteenth Day of March 1985

[SEAL]

Attest:

DONALD J. QUIGG

Attesting Officer

Acting Commissioner of Patents and Trademarks